(12) United States Patent
Shah et al.

(10) Patent No.: US 12,010,820 B2
(45) Date of Patent: Jun. 11, 2024

(54) LIQUID IMMERSION COOLING PLATFORM AND COMPONENTS THEREOF

(71) Applicant: MODINE LLC, Racine, WI (US)

(72) Inventors: Jimil Shah, Plano, TX (US); Jacob Mertel, Plano, TX (US)

(73) Assignee: Modine LLC, Racine, WI (US)

( * ) Notice: Subject to any disclaimer, the term of this patent is extended or adjusted under 35 U.S.C. 154(b) by 49 days.

(21) Appl. No.: 17/476,217

(22) Filed: Sep. 15, 2021

(65) Prior Publication Data

US 2023/0080447 A1 Mar. 16, 2023

(51) Int. Cl.
*H05K 7/20* (2006.01)

(52) U.S. Cl.
CPC ..... *H05K 7/20836* (2013.01); *H05K 7/20236* (2013.01); *H05K 7/20272* (2013.01); *H05K 7/20781* (2013.01)

(58) Field of Classification Search
CPC .......... H05K 7/20836; H05K 7/20236; H05K 7/20272; H05K 7/20781; H05K 7/20327; H05K 7/20818; H05K 7/203; Y02D 10/00
See application file for complete search history.

(56) References Cited

U.S. PATENT DOCUMENTS

| | | | | |
|---|---|---|---|---|
| 5,305,184 A * | 4/1994 | Andresen | ........... | H05K 7/20872 361/720 |
| 5,373,417 A * | 12/1994 | Barrett | ............... | H05K 7/20236 257/E23.09 |
| 9,335,802 B2 | 5/2016 | Shelnutt et al. | | |
| 11,490,546 B2 * | 11/2022 | Edmunds | ........... | H05K 7/20772 |
| 2007/0267741 A1 | 11/2007 | Attlesey et al. | | |
| 2011/0075118 A1 * | 3/2011 | Jacobs | ................... | G03B 27/52 355/30 |
| 2013/0105122 A1 | 5/2013 | Campbell et al. | | |
| 2014/0362527 A1 | 12/2014 | Best | | |

(Continued)

FOREIGN PATENT DOCUMENTS

| | | |
|---|---|---|
| KR | 20210082239 A | 7/2021 |
| WO | 2020102090 A1 | 5/2020 |

OTHER PUBLICATIONS

International Search Report and Written Opinion dated Feb. 15, 2023 issued in PCT/US2022/43473.

(Continued)

*Primary Examiner* — Stephen S Sul

(74) *Attorney, Agent, or Firm* — Michael Best & Friedrich LLP

(57) ABSTRACT

The present disclosure refers to an immersion cooling system and process. Representative embodiments include an interface for interconnecting the inside of the vessel to the outside using an exemplary pass through plates. Additional embodiments include carbon tapes at the opening areas of the vessel. In one example embodiment, a ledge for returning any fluid that is condensed on the top door of the vessel may be provided. Representative features also may include roller covering or overlays, pipes to deliver a spray to clean components, and/or cooling a pump to prevent premature failure. Other embodiments include mechanisms for pump life improvement, gap fillers to reduce fluid needed, and improved vapor management techniques.

21 Claims, 12 Drawing Sheets

(56) References Cited

U.S. PATENT DOCUMENTS

| | | | |
|---|---|---|---|
| 2015/0070846 A1* | 3/2015 | Shelnutt | H05K 7/20809 |
| | | | 361/699 |
| 2015/0109728 A1* | 4/2015 | Campbell | H05K 7/20336 |
| | | | 361/679.47 |
| 2015/0181762 A1 | 6/2015 | Boyd et al. | |
| 2018/0042138 A1* | 2/2018 | Campbell | H05K 7/203 |
| 2018/0303008 A1* | 10/2018 | Shen | H05K 7/20318 |
| 2020/0084918 A1 | 3/2020 | Shen et al. | |
| 2021/0059079 A1* | 2/2021 | Keehn | H05K 7/20327 |
| 2023/0057498 A1* | 2/2023 | Gao | H05K 7/20318 |

OTHER PUBLICATIONS

International Preliminary Report on Patentability for Application No. PCT/US2022/043473 dated Mar. 5, 2024 (8 pages).

\* cited by examiner

LIQUID IMMERSION COOLING PLATFORM AND COMPONENTS THEREOF

CROSS-REFERENCE TO RELATED APPLICATIONS

This application is related to PCT publication WO2020/102090 filed Nov. 11, 2019 titled "Liquid Immersion Cooling Platform" owned by TMGCore, LLC which application is incorporated herein by reference.

FIELD OF THE DISCLOSURE

The present disclosure relates to a liquid immersion cooling system adapted for any hardware input and output specifications, for example, a liquid immersion cooling system including a customizable pass through plate as well as other useful features.

BACKGROUND AND SUMMARY

Traditional computing and/or server systems utilize air to cool the various components. Traditional liquid or water cooled computers utilize a flowing liquid to draw heat from computer components but avoid direct contact between the computer components and the liquid itself. The development of electrically non-conductive and/or dielectric fluid enables the use of immersion cooling in which computer components and other electronics may be submerged in a dielectric or electrically non-conductive liquid in order to draw heat directly from the component into the liquid. Immersion cooling can be used to reduce the total energy needed to cool computer components and may also reduce the amount of space and equipment necessary for adequate cooling.

The liquid immersion cooling systems are being implemented for various computing needs. Each implementation of these systems, however, may require a different hardware specification. For example, the hardware design for the power, signal, data and fluid input and output for each system can vary depending on the specific needs of the customer, the country or state at which the system is implemented and the exact nature of the implementation (e.g., graphic-intensive uses or processing-intensive uses). At the same time, liquid immersion cooling systems usually utilize volatile and very expensive dielectric fluids which can in some cases easily evaporate, and thus, vapor preservation, among others, may be an important aspect of a liquid immersion cooling system. As such, it is beneficial to describe an immersion cooling system which can be easily adapted for every power, signal, data and fluid input and output hardware specification.

Advantageously, the instant application pertains to a new interface for interconnecting the inside of a vessel to the outside using an exemplary pass through plate. The present application also describes vapor preservation techniques which can be achieved by placing carbon tapes at the opening areas of the vessel. The present disclosure also describes a ledge for returning any fluid that is condensed on the top door of the vessel. The present disclosure further describes a spray technique for ensuring that residue and deposits do not form on computer components of the vessel. In addition, the present disclosure also relates to methods and systems that may assist in fluid circulation and/or other pumps to last longer and/or prevent failures.

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Various embodiments of the present disclosure, together with further objects and advantages, may best be understood by reference to the following description taken in conjunction with the accompanying drawings.

DETAILED DESCRIPTION

Figure 1:
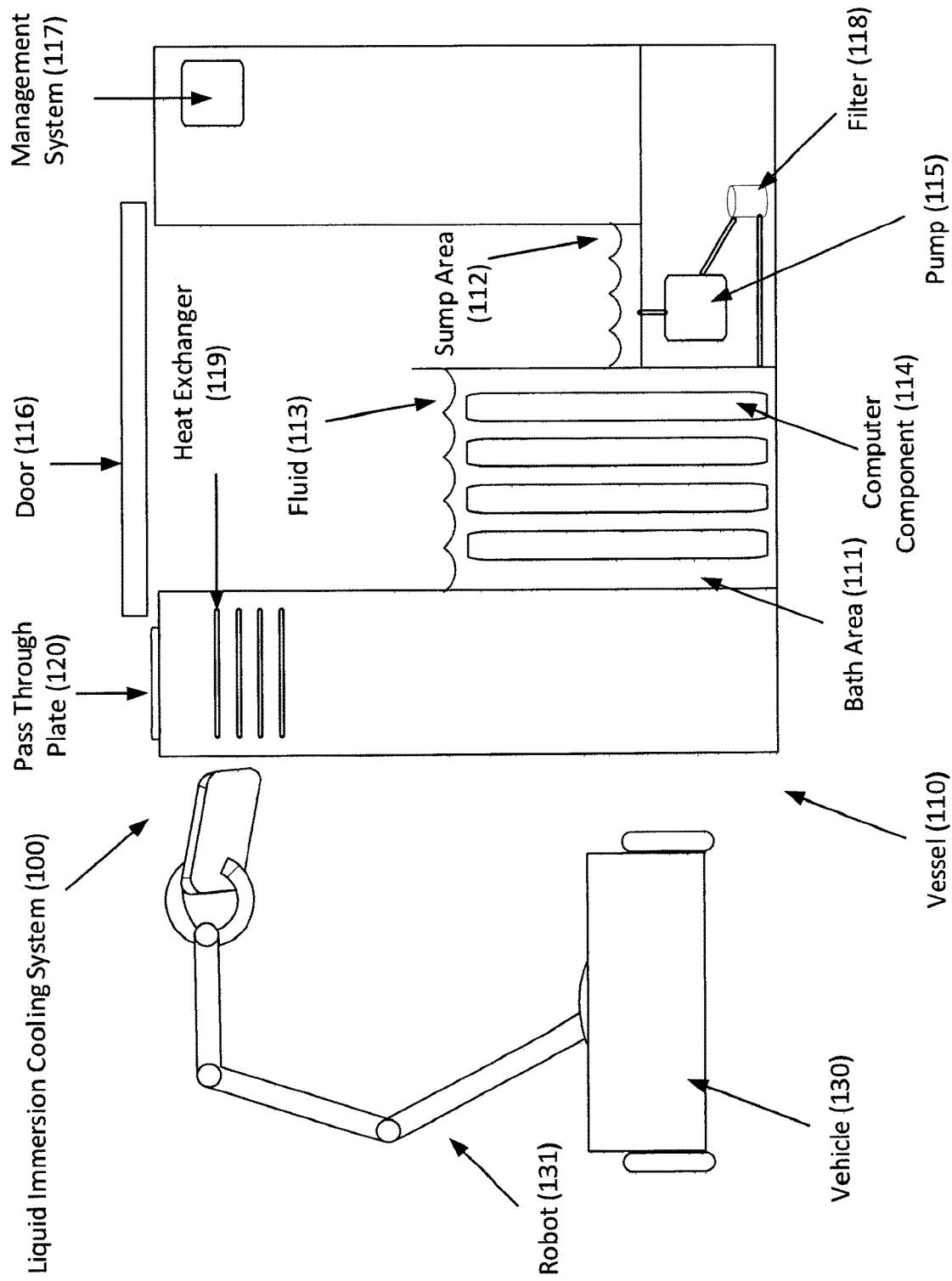
FIG. 1 shows a liquid immersion cooling system according to an example embodiment of the present disclosure.

The following description of embodiments provides a non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

Pass Through Plate

In one example embodiment, an immersion cooling system or a vessel can include a bath area, a sump area, a computing device, a robot, a pressure control system and a management system. The vessel can be a pressure controlled tank maintained at the atmospheric pressure (or within a range thereof) which can be cooled using a heat exchanger. The computing device can be immersed in a dielectric fluid in the bath area of the vessel. The computing device can be connected to a network and perform various processing and computing tasks while immersed in the dielectric fluid. The vessel can include a lid for accessing the bath area, the computing device and the sump area. The vessel can be fluidly coupled to the pressure control system. The robot can lift the computing device from the bath area of the vessel when the lid is open. The robot can place the lifted computing device in a magazine provided for storage of computing devices or on a vehicle. The robot can also lift a computing device from the magazine (or vehicle) and place it in the place of the computing device that was lifted from the bath area. The robot can be affixed to the vessel, the vehicle or another location.

In one example embodiment, the vessel can be connected to various input and/or output cables located outside of the vessel. These cables can provide power, data, and/or signals to the vessel. These cables can be electrically coupled to a pass through plate, which can be electrically coupled to one or more cables or devices located inside the vessel. In one example embodiment, the vessel can be connected to various inflow and/or outflow pipes located outside of the vessel. These pipes can be fluidly coupled to a pass through plate, which can provide dielectric fluid, vapor and/or cooling fluid to the vessel. These pipes can be fluidly coupled to one or more pipes located inside the vessel. In one example embodiment, the vessel can be connected to various input and/or output fiber optic cables located outside of the vessel. These fiber optic cables can provide data and/or signals to the vessel. These fiber optic cables can be coupled to a pass through plate, which can be coupled to one or more fiber optic cables or devices located inside the vessel. These examples illustrate various embodiments of the pass through plate. One of ordinary skill in the art recognizes that the pass through plate can transmit or transfer other signals, information, data, objects, things, etc., into the vessel.

FIG. 1 shows a liquid immersion cooling system 100 according to an example embodiment of the present disclosure. In this example embodiment, the liquid immersion cooling system 100 can include a vessel 110 and a vehicle 130. The vessel 110 can include a bath area 111, a sump area 112, a fluid 113, a computer component 114, a pump 115, a filter 118, a door 116, a management system 117, a heat exchanger 119 and a pass through plate 120. The computer component 114 can be submersed in the fluid 113. The vehicle 130 can include a robot 131. The robot 131 can lift the computer component 114 when the door 116 is open and place the computer component 114 on the vehicle 130.

In this example embodiment, the pass through plate 120 can be located on the top of the vessel 110. However, one of ordinary skill in the art recognizes that the pass through plate 120 can be located on the side, bottom or even the door 116 of the vessel 110. The pass through plate 120 can be, e.g., a flat metal sheet that is affixed to the vessel using one or more screws. In between the pass through plate 120 and the vessel 110, there can be a gasket to prevent any leakage of vapor from the vessel 110.

Figure 2:
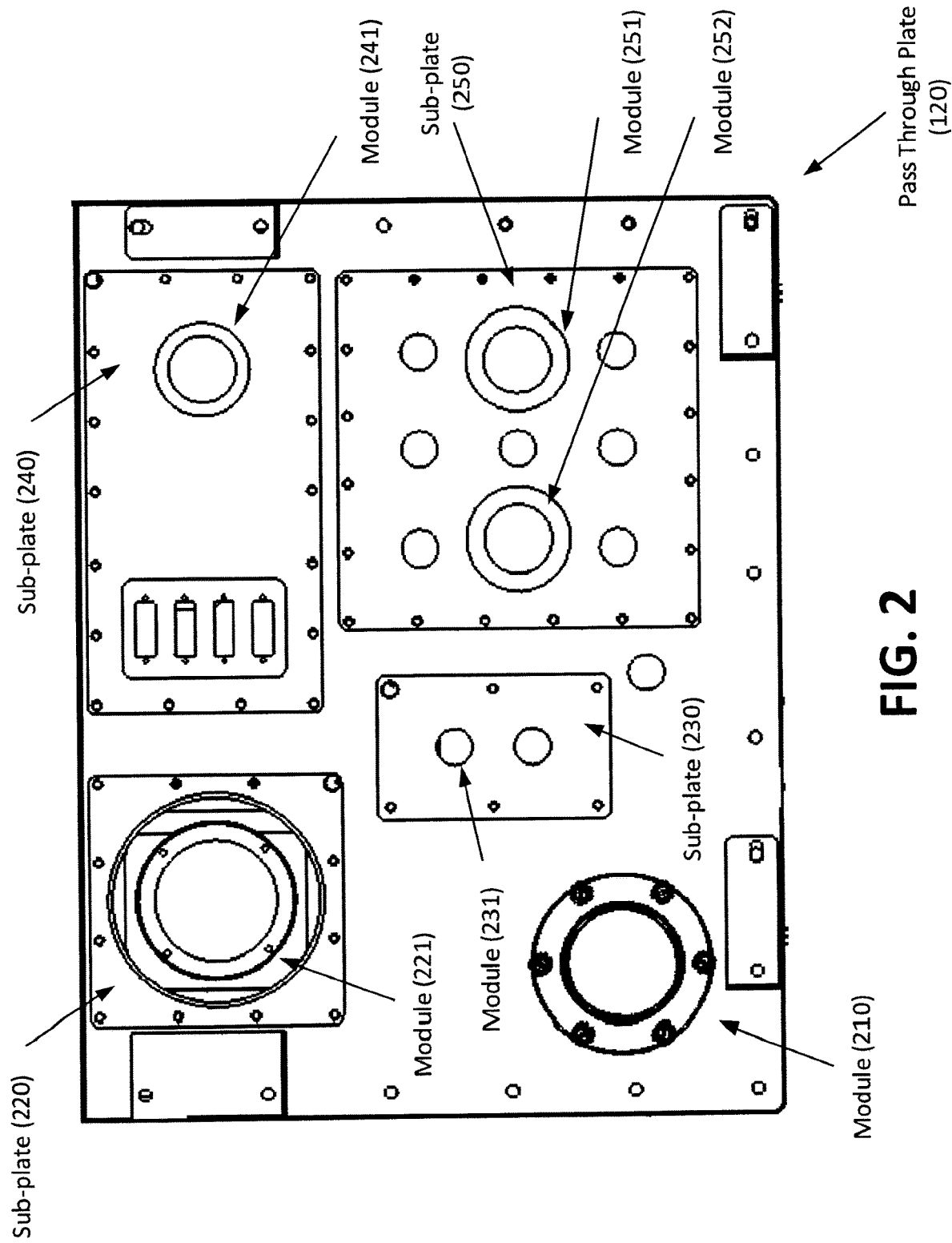
FIG. 2 shows an example pass through plate according to an example embodiment.

FIG. 2 shows an example pass through plate 120 according to an example embodiment. In this example embodiment, the pass through plate 120 can be located on the top of the vessel 110. The pass through plate 120 can include a plurality of sub-plates 220, 230, 240, and 250. The pass through plate 120 can include one or more modules, e.g., a module 210. One or more of the sub-plates 220, 230, 240, and 250 can include one or more modules, e.g., modules 221, 231, 241, 251 and 252. In one example embodiment, a module can be a hermetically sealed medium for conducting electricity or electronic signals. In one example embodiment, a module can be a hermetically sealed conduit for transferring a fluid, e.g., liquid or vapor. In one example embodiment, a module and/or a sub-plate can be directly mounted on a body of the vessel. In one example embodiment, a pass through plate can include a plurality of modules.

In the example embodiment of FIG. 2, the modules 210, 251 and 252 can be utilized for passing fluids. For example, the module 210 can be connected to a dielectric fluid source. The module 210 can be used to fill the bath area 111 of the vessel 110 with dielectric fluid. As another example, the modules 251 and 252 can be used for inflow and outflow of cooling liquid to the vessel 110. In this example, the vessel 110 can include a heat exchanger which can receive a cool liquid from the module 251. Heat can transfer from the vessel 110 to the liquid. Once the heat is transferred to the liquid, the warm liquid can be sent out of the vessel 110 using the module 252.

In the example embodiment of FIG. 2, the modules 220, 231 and 241 can be used for sending electricity and/or signals to and/or receiving electricity and/or signals from the vessel 110. For example, the module 221 can be used to receive electricity to power up the vessel 110 for its computing operations. As another example, the module 231 can be used to transmit commands to and/or receive commands from the vessel 110. These commands can facilitate the operation of the vessel 110. As yet another example, the module 241 can be used for sending and/receiving data signals.

Figure 3:
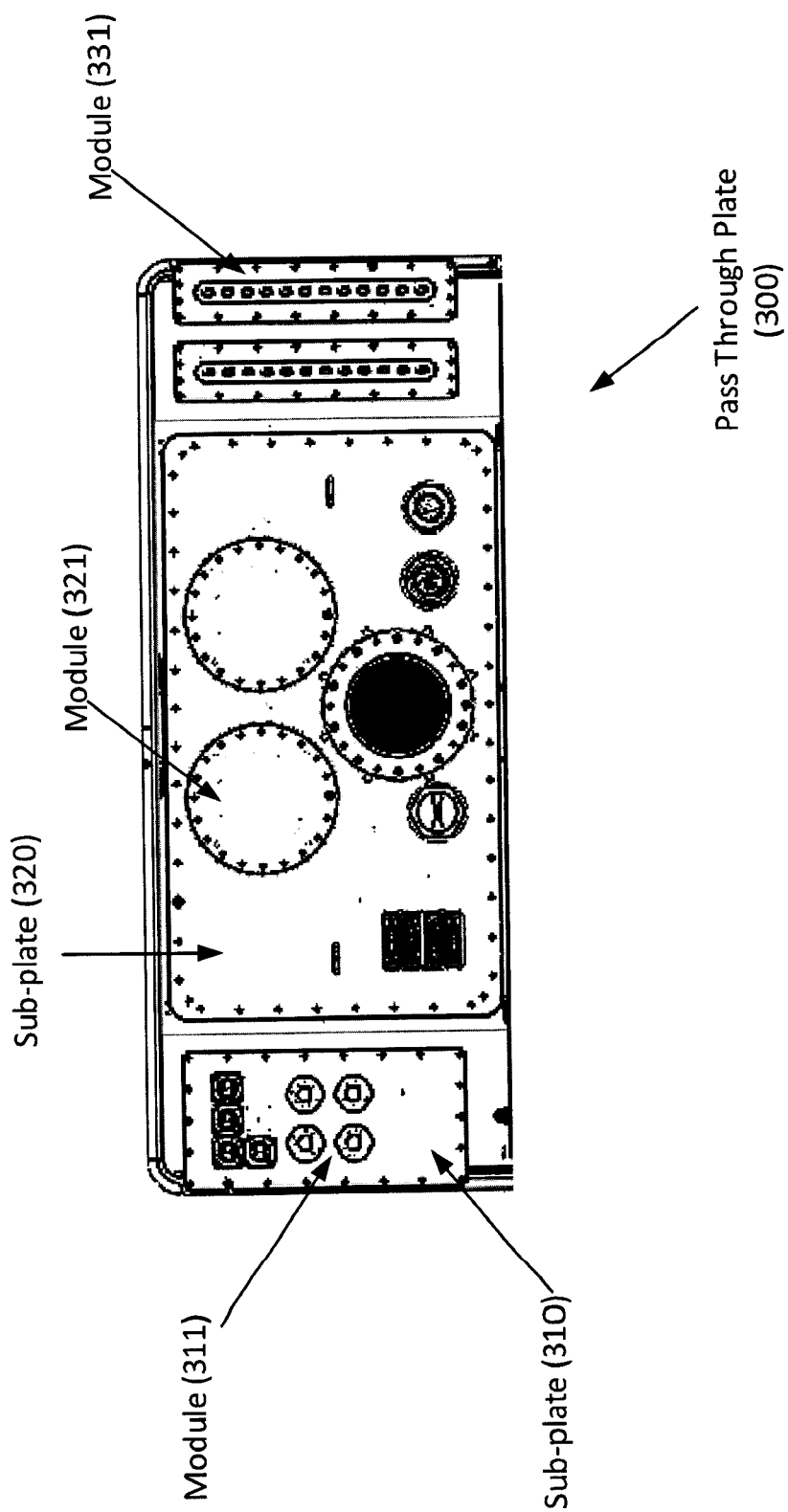
FIG. 3 shows another example pass through plate according to an example embodiment.

FIG. 3 shows another example pass through plate 300 according to an example embodiment. In this example embodiment, the pass through plate 120 can be located on a side of the vessel 110. The pass through plate 300 can include sub-plates 310 and 320, and modules 311, 321 and 331. In this example embodiment, the modules can transmit high current power and/or signals. As another example, the modules can operate as filters, fiber optic connectors and/or Ethernet connectors.

Figure 4:
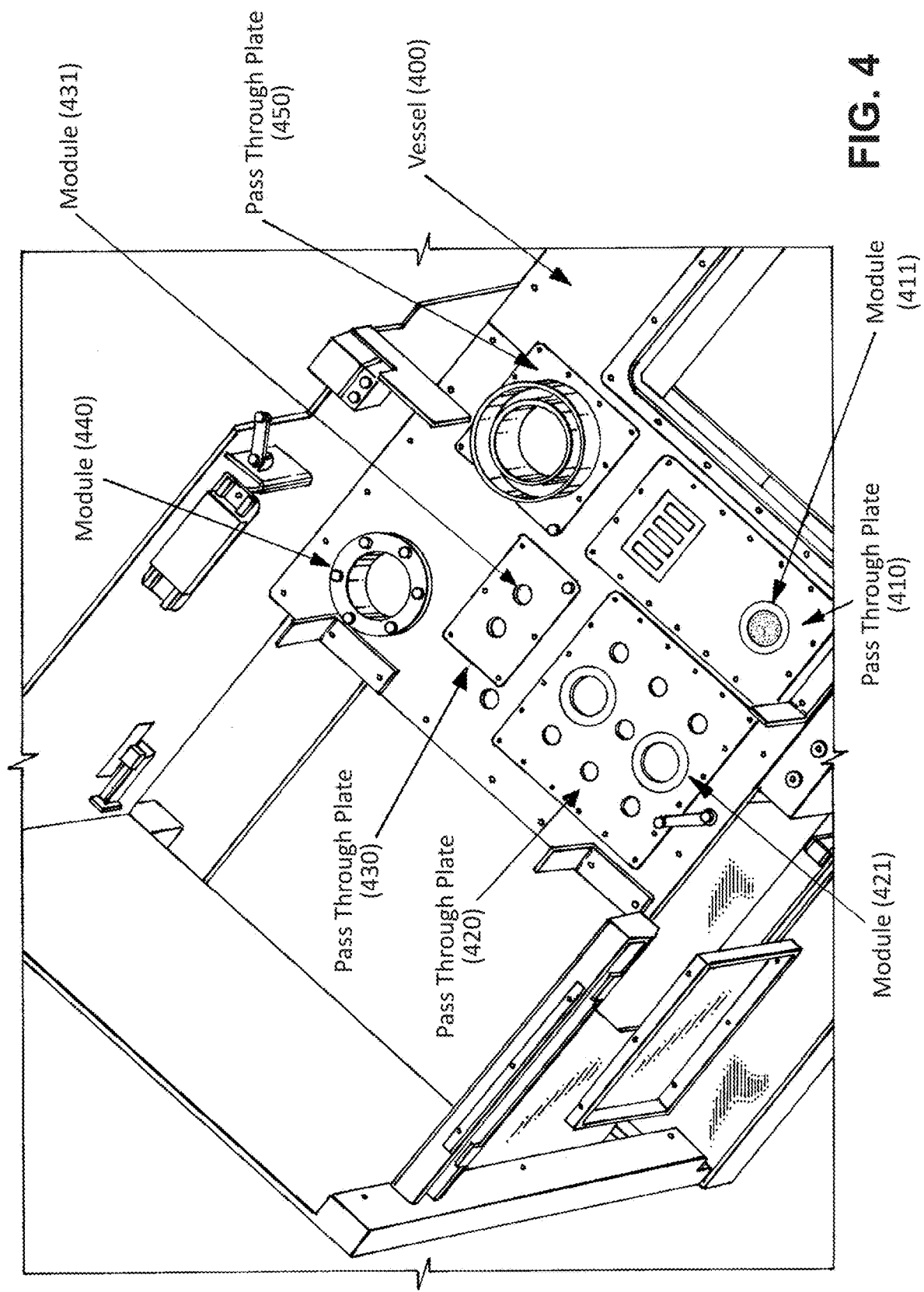
FIG. 4 shows a top view of a plurality of pass through plates in an example vessel.

FIG. 4 shows a top view of a plurality of pass through plates in an example vessel 400. In this example embodiment, a plurality of pass through plates 410, 420, 430 and 450 can be provided. Each pass through plate can include one or more modules, e.g., modules 411, 421 and 431. The vessel 400 can also include a module 440 for transferring a dielectric fluid into the vessel 400. The pass through plate 450 can include a pressure release valve, which can maintain the pressure inside the vessel 400 when the pressure exceeds a predetermined amount or falls below another predetermined amount. In one example, the pass through plate 450 can also include a desiccant and a fan inside the vessel. The desiccant can remove moisture from the vessel 400 and the fan can circulate the air and/or vapor within the tank. In one example, the fan can facilitate the operation of the desiccant.

Figure 5:
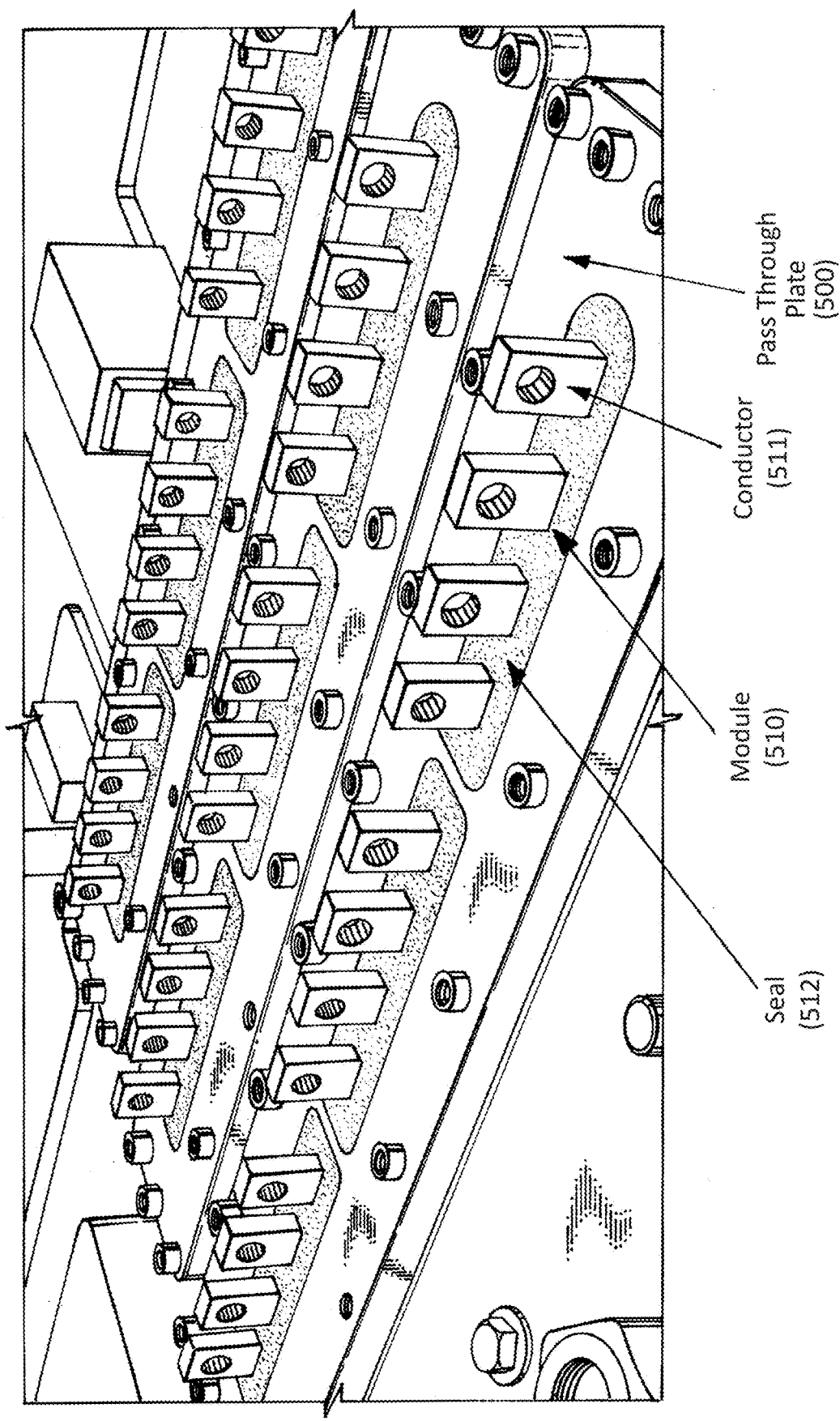
FIG. 5 shows yet another example pass through plate according to an example embodiment.

FIG. 5 shows an example pass through plate 500 according to an example embodiment. In this example embodiment, the pass through plate 500 can include a module 510, which can include a conductor 511 and a seal 512. The conductor 511 can be a bar, rod or wire (made from, e.g., copper) for transmitting electric power to the vessel. The conductor 511 can pass through the pass through plate 500 such that, e.g., power cables can be coupled to the conductor 511 inside the vessel. The seal 512 can fill the space between the pass through plate 500 and the conductor 511 so that the pass through plate 500 is hermetically sealed, e.g., no vapor may escape the vessel through the pass through plate 500.

Figure 6:
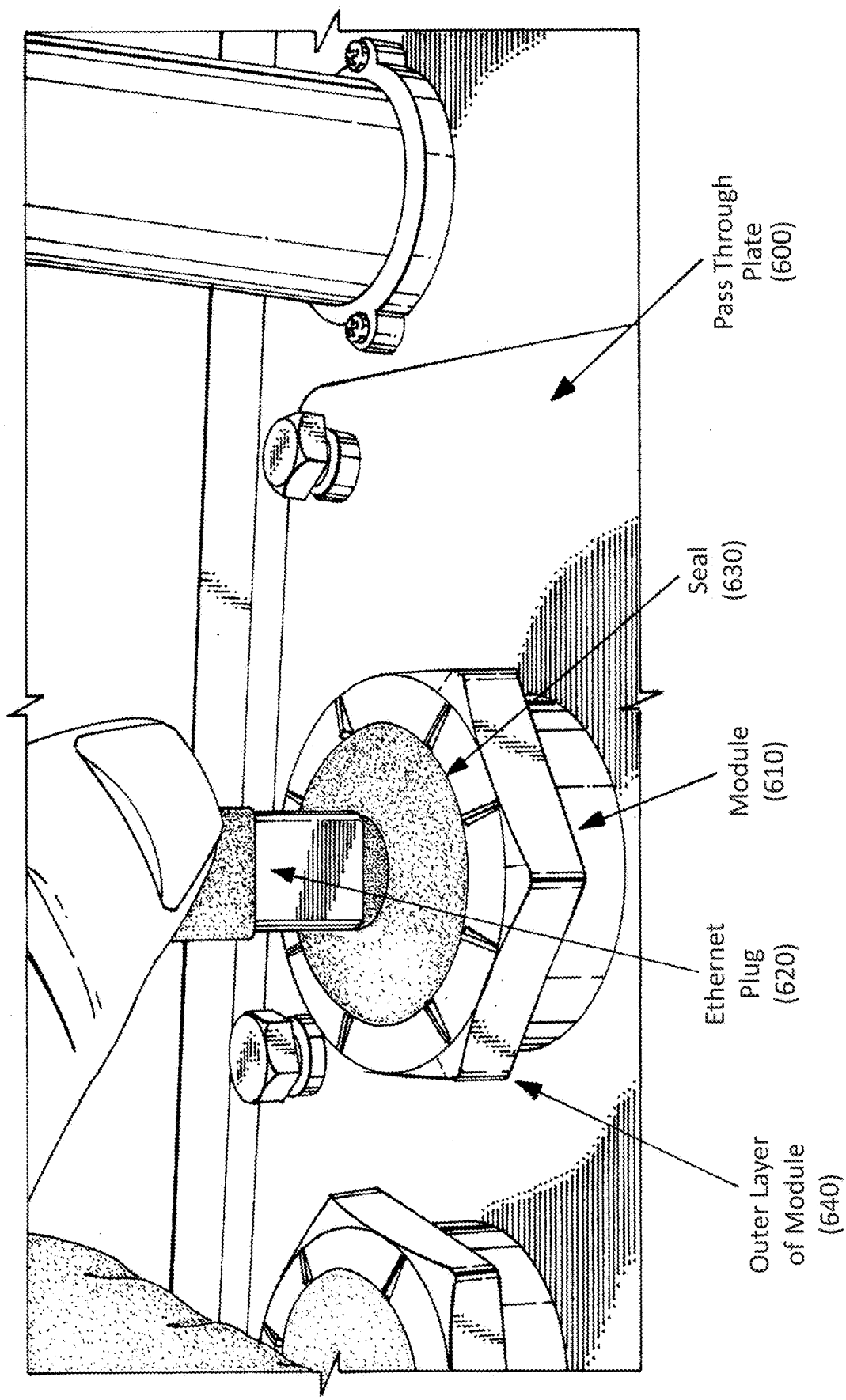
FIG. 6 shows yet another example pass through plate according to an example embodiment.

FIG. 6 shows an example pass through plate 600 according to an example embodiment. In this example embodiment, the pass through plate 600 can include a module 610, which comprises an Ethernet plug 620, a seal 630 and an outer layer 640. In this example embodiment, the jacket of an Ethernet cable is removed and each individual strand of wire in the cable is sealed using the seal 630. This can prevent leakage of vapor through the Ethernet plug.

In one example embodiment, a pass through plate or a sub-plate can be flat. In one example embodiment, a coat of a sealant can be applied to a pass through plate or a sub-plate, e.g., a coat of epoxy or plaster can be applied. In one example, the pass through plate or sub-plate can be applied with pressure to the body of the vessel. For example, an attaching mechanism such as a screw can affix the pass through plate or sub-plate to the body of the vessel with pressure. In one example embodiment, a pass through plate or a sub-plate can include a gasket or other sealing mechanism under the pass through plate or the sub-plate to hermetically seal the vessel. For example, an O-ring or another sealing mechanism can be provided under the pass through plate or sub-plate to prevent vapor leakage from the vessel. In one example embodiment, a pass through plate and a sub-plate can include the same components, a similar construct and/or function the same. In one example embodiment, the vessel only includes a pass through plate and no sub-plate. In one example embodiment, the vessel only includes a sub-plate and no pass through plate.

In one example embodiment, the module can have two interfaces, one on the outside and one on the inside. The outside interface can be coupled to an incoming cable from outside the vessel. The inside interface of the module can be coupled to another plug or cable inside the vessel. The plug or cable inside the vessel can be electrically coupled to a computing device or another device or system (e.g., management system). In one example embodiment, a module can be bolted to a pass through plate, a sub-plate or an outer body of the vessel. The module can include a gasket such as an O-ring under it to hermetically seal the connection between the module and the pass through plate or vessel. In one example embodiment, a module can include a conductor in the middle which is fixed to an outer layer of the module using a sealing material, e.g., epoxy or plaster. The epoxy or plaster can hermetically seal the connection between the conductor and the outer layer of the module. In one example embodiment, the seal is compatible with exposure to the dielectric fluid. In one example embodiment, the seal can bond with metals. In one example embodiment, a module can include an Ethernet plug. In one example embodiment, a module can include a DB-15 signal connector or a PCB cable. In one example embodiment, a module can include a metal bar such as a copper bar.

Vapor Management System

Figure 7:
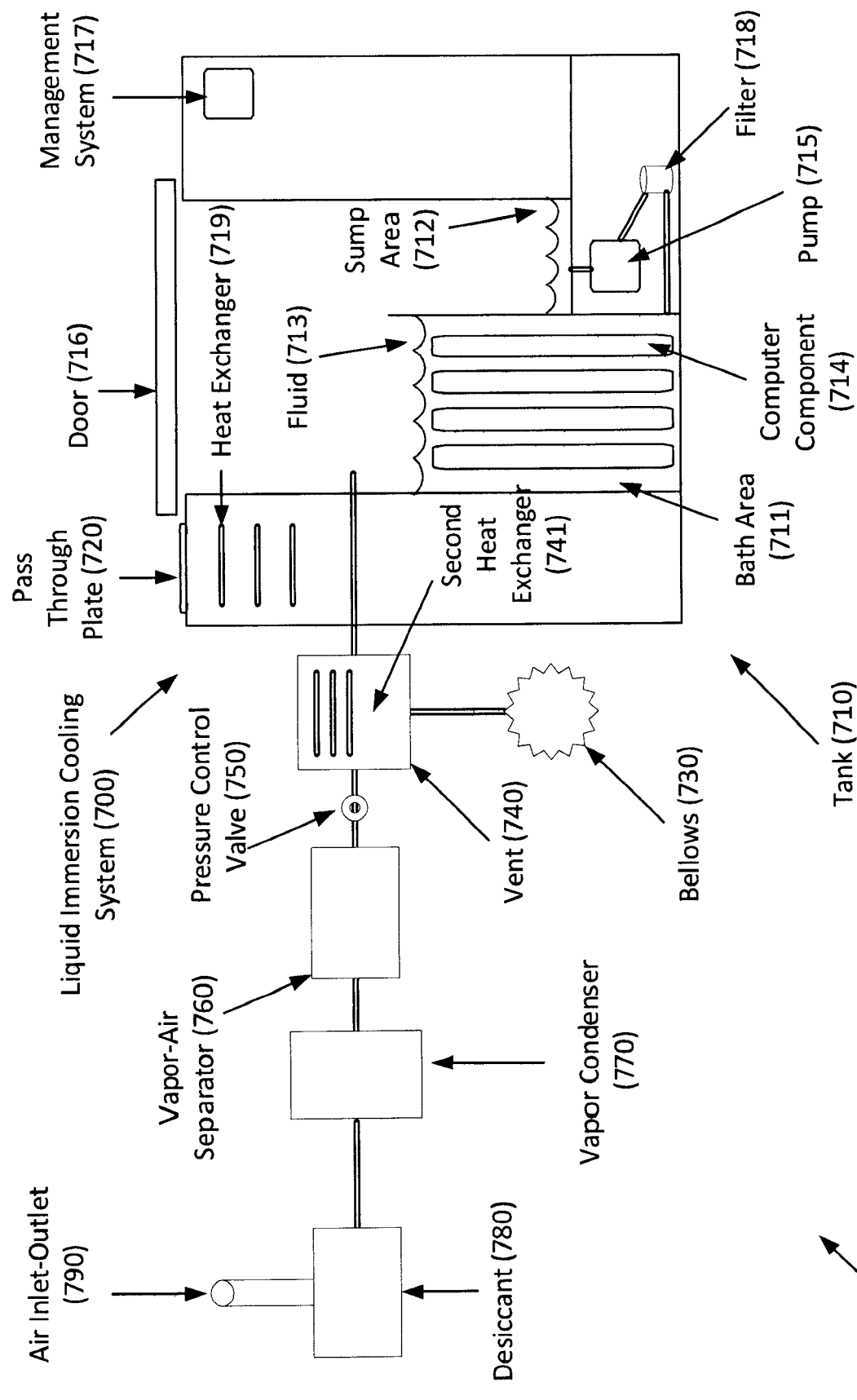
FIG. 7 shows a liquid immersion cooling system and vapor management system according to another example embodiment of the present disclosure.

FIG. 7 shows a liquid immersion cooling system 700 according to an example embodiment of the present disclosure. In this example embodiment, the liquid immersion cooling system 700 can include a vessel 705 which can include a tank 710. The tank 710 can include a bath area 711, a sump area 712, a fluid 713, a computer component 714, a pump 715, a filter 718, a door 716, a management system 717, a heat exchanger 719 and a pass through plate 720. The computer component or components 714 can be submersed in the fluid 713.

The tank 710 includes a pressure controller to reduce or increase an interior pressure of the tank 710. The pressure controller may include any one of or a combination of the bellows 730, the vent 740, the pressure control valve 750, the vapor-air separator 760, the vapor condenser 770, the desiccant 780, and the air inlet-outlet 790. In one example embodiment, when a pressure of the vapor inside the tank 710 increases above a desired pressure, the vapor can flow into the vent 740. In a first mode of operation, the pressure control valve 750 can be closed. Therefore, the vapor can accumulate inside the bellows 730, and thus, the pressure of the tank 710 can be maintained at a desired level. In one example embodiment, the vent 740 can include a fan for forced transfer of the vapor from the tank to the bellows 730. In one example embodiment, the vent 740 can include a second heat exchanger 741, which can condense vapor before sending the vapor to the bellows 730. In this example, the condensed vapor can be returned to the tank 710, but any remaining vapor can be transferred to the bellows 730. In one example embodiment, there can be a valve between the vent 740 and the bellows 730 for connecting and/or disconnecting the bellow 730 from the vent 740 and the tank 710. The bellows 730 can be disconnected by the management system 717 if, e.g., the pressure inside the tank increases beyond a threshold pressure or the bellows rupture.

In one example embodiment, when a pressure of the vapor inside the tank 710 increases above a desired pressure, the vapor can flow into the vent 740. In a first mode of operation, the pressure control valve 750 can be closed. Therefore, the vapor can accumulate inside the bellows 730, and thus, the pressure of the tank 710 can be maintained at a desired level. In one example embodiment, the vent 740 can include a fan for forced transfer of the vapor from the tank to the bellows 730. In one example embodiment, the vent 740 can include a second heat exchanger 741, which can condense vapor before sending the vapor to the bellows 730. In this example, the condensed vapor can be returned to the tank 710, but any remaining vapor can be transferred to the bellows 730. In one example embodiment, there can be a valve between the vent 740 and the bellows 730 for connecting and/or disconnecting the bellow 730 from the vent 740 and the tank 710. The bellows 730 can be disconnected by the management system 717 if, e.g., the pressure inside the tank increases beyond a threshold pressure or the bellows rupture.

In one example embodiment, the tank 710 can include a pressure sensor. When the pressure of the tank increases beyond a predetermined threshold pressure, the pressure control valve 750 can be opened, e.g., using a signal from the management system 717. In this example embodiment, the vapor can pass into the vapor-air separator 760. The vapor-air separator 760 can be a carbon bed which can capture any vapor mixed with air. As a result, the vapor molecules can stay with the vapor-air separator 760, and air can pass onto to the condenser 770. The condenser 770 can further capture any vapor molecules remaining in the air. After the vapor condenser 770, the air can pass onto the desiccant 780 and exit the vessel 705 into the atmosphere.

In one example embodiment, when a pressure of the tank 710 decreases below a desired pressure, the tank 710 can draw vapor from the vent 740. In a first mode of operation, the pressure control valve 750 can be closed. Therefore, the vapor can be drawn from the bellows 730, and thus, the pressure of the tank 710 can be maintained at a desired level. In one example embodiment, the vent 740 can transfer the vapor from the bellows 730 into the tank 710, e.g., using a fan.

In one example embodiment, the tank 710 can include a pressure sensor. When the pressure of the tank decreases below a predetermined threshold pressure, the pressure control valve 750 can be opened, e.g., using a signal from the management system 717. In this example embodiment, air can be drawn from the atmosphere and transferred into the tank 710 to maintain the pressure inside the tank 710. For example, atmosphere air can be drawn from the air inlet-outlet 790 and passed into the desiccant 780. The desiccant 780 can remove any moisture from the incoming air. Then, the incoming air can optionally pass through a heater (or the vapor condenser 770) and arrive at the vapor-air separator 760. The incoming air can pick up vapor molecules from the vapor-air separator 760 and deliver the vapor to the tank 710 through the vent 740.

In one example embodiment, the vapor condenser 770 can be an optional component of the vessel 705. In one example embodiment, the vapor condenser 770 can be replaced with a heater to facilitate detachment of vapor molecules from the carbon bed.

Carbon Traps and Fluid Return Mechanism

Figure 8:
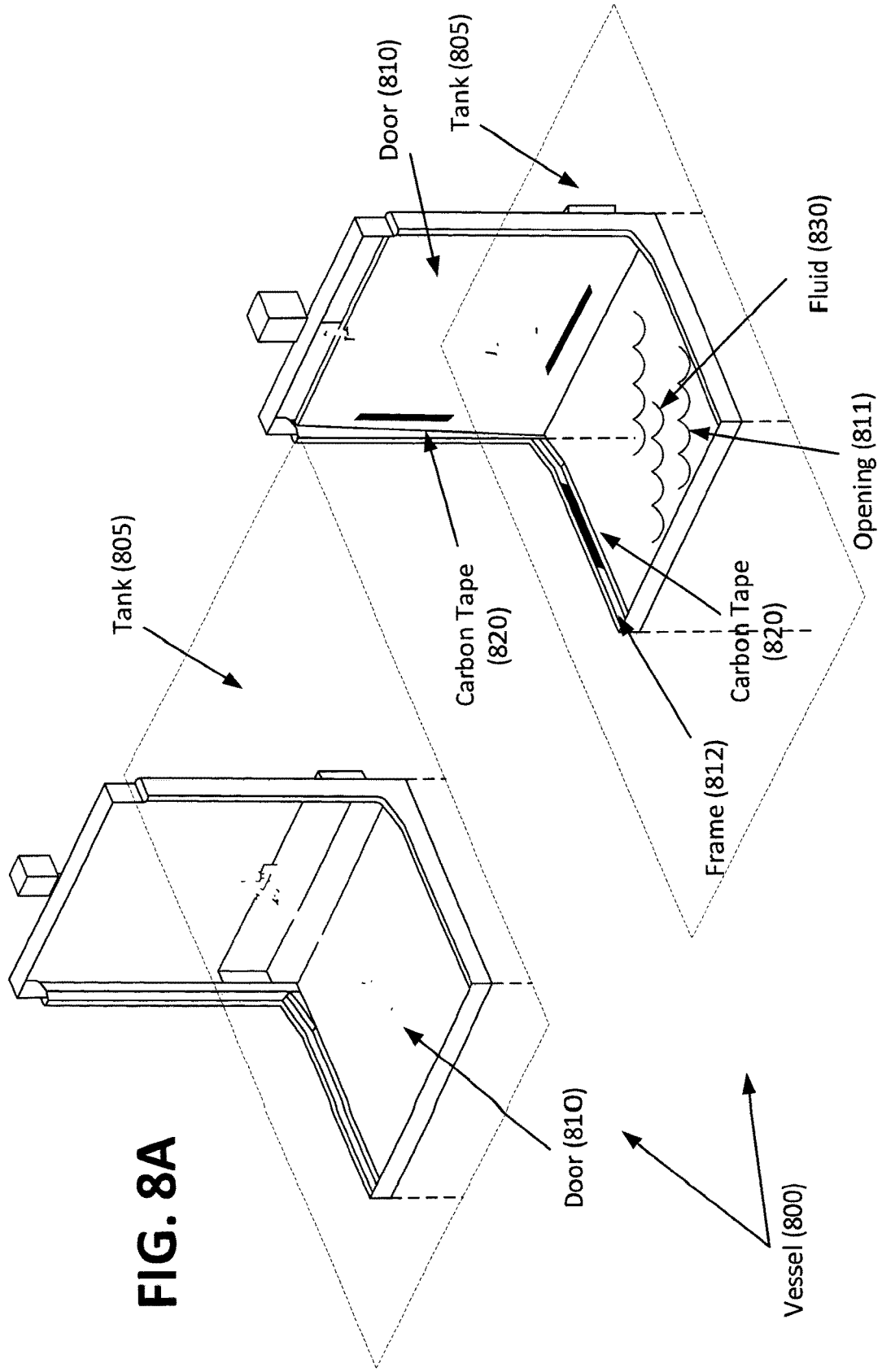
FIG. 8A shows an example door of an immersion cooling system according to an example embodiment.
FIG. 8B shows an example door with carbon tape of an immersion cooling system according to an example embodiment

FIG. 8 shows an example door of an immersion cooling system according to an example embodiment. In this example embodiment, a vessel 800 can include a door 810, which can be opened for removing computer components from a tank 805. FIG. 8A shows the door 810 when the door is closed and FIG. 8B shows the door 810 when the door is opened. In one example embodiment, removing the computer components from the tank 805 can result in loss of vapor. As such, in this example embodiment, one or more carbon traps can be provided on, around or within a vicinity of the door 810 to absorb or adsorb the vapor before it escapes from the tank 805. The specific type of carbon trap employed may vary depending upon the components, operating conditions, and vessel configuration. Suitable carbon traps include, but are not limited to, carbon tape, carbon glue, groove on tank with carbon to absorb or adsorb, and combinations thereof positioned at or near places where fluid loss may be likely to occur. As shown in FIG. 8B tapes 820 can be provided on, around or within a vicinity of the door 810 to absorb and/or adsorb the vapor before it escapes from the tank 805. For example, a carbon tape 820 can be provided on the door 810. As another example, a carbon tape 820 can be provided on a frame 812 of the tank 805. The carbon tape 820 can be within a threshold distance of the opening 811, e.g., 1, 2, 3 or even 5 inches of the opening 811 of the tank 805. In one example, the carbon tape 820 can be attached to a ceiling of the tank 805.

Figure 9:
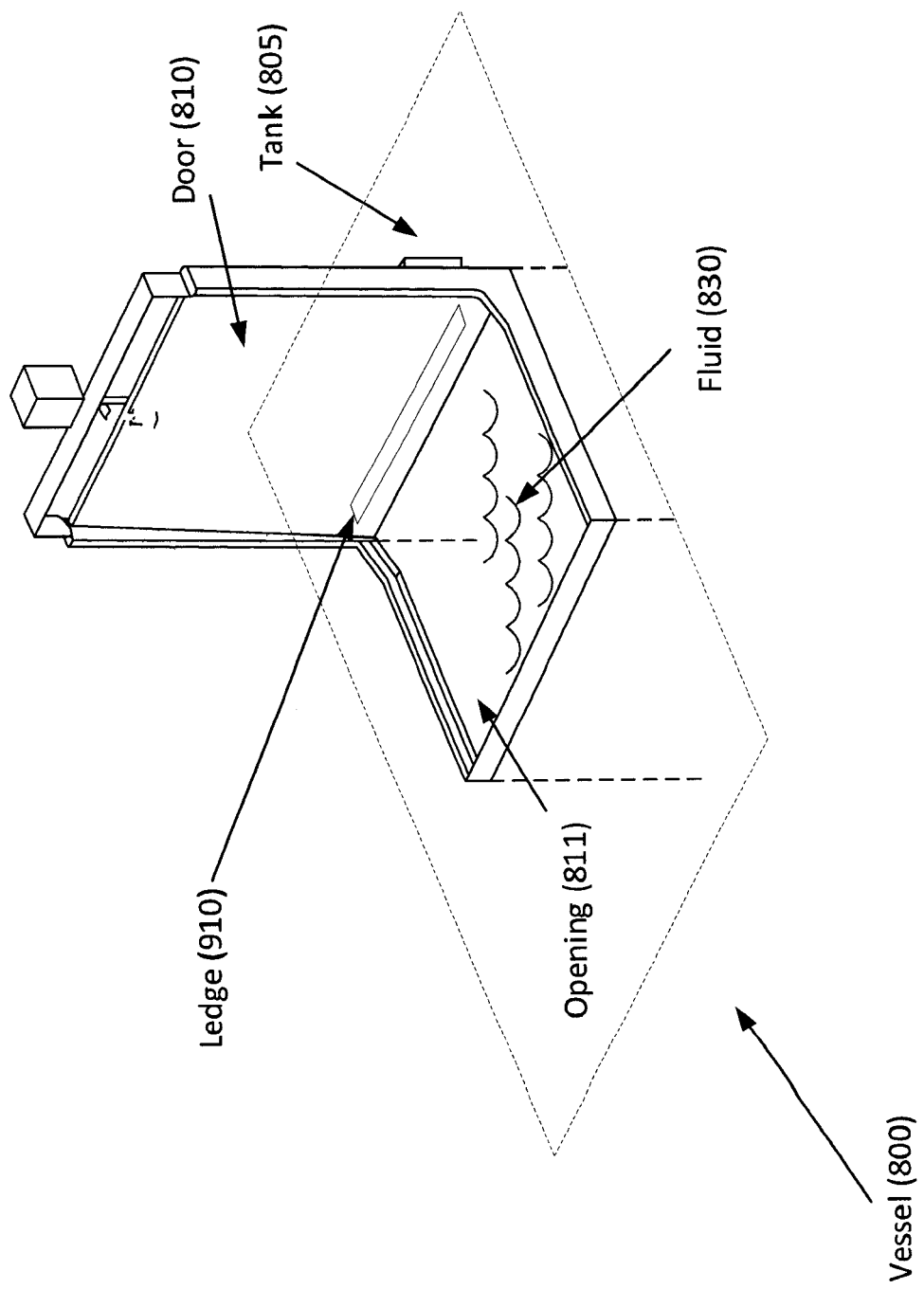
FIG. 9 shows an example door of an immersion cooling system according to an example embodiment.

FIG. 9 shows an example door of an immersion cooling system according to an example embodiment. In this example embodiment, the vessel 800 can include a door 810, which can be opened for removing computer components from a tank 805. In one example embodiment, when the vessel 800 is in operation, the internal temperature of the vessel 800 may be higher than the temperature of the environment outside and/or around the vessel 800. Accordingly, vapor from the tank 805 can condense on the door 810. When the door 810 is opened, the condensed fluid on the door 810 may drip outside of the tank 805. As such, the door 810 can include a ledge 910 (inside or outside) for collecting the fluid and guiding the fluid into the tank 805, e.g., while the door is open or when the door is closed. In one example, another mechanism for collecting the fluid from the door 810 can be provided. For example, the door 810 can be opened in a way such that the bottom of the door is always over the opening 811, e.g., the bottom of the door 810 can be pushed toward the opening 811 when the door is opened. In this manner, that if any fluid drips, it drips into the tank 805. In one example embodiment, a fluid repellant coat can be applied to the door 810 to prevent condensation of the fluids on the door 810. In another example embodiment an obstacle such as a metal enclosure around the opening 811 can be employed to guard against fluid losses. Such obstacles may protect dielectric fluid vapor from turbulent air or wind flowing across the dielectric fluid vapor and moving it outside the area over the tank. A carbon trap may also be attached to the frame or a vapor-air separator may be employed wherein air is employed as a sweep gas as a desorption mechanism.

Interior Tank Covering or Overlayment Below Lid

Figure 10:
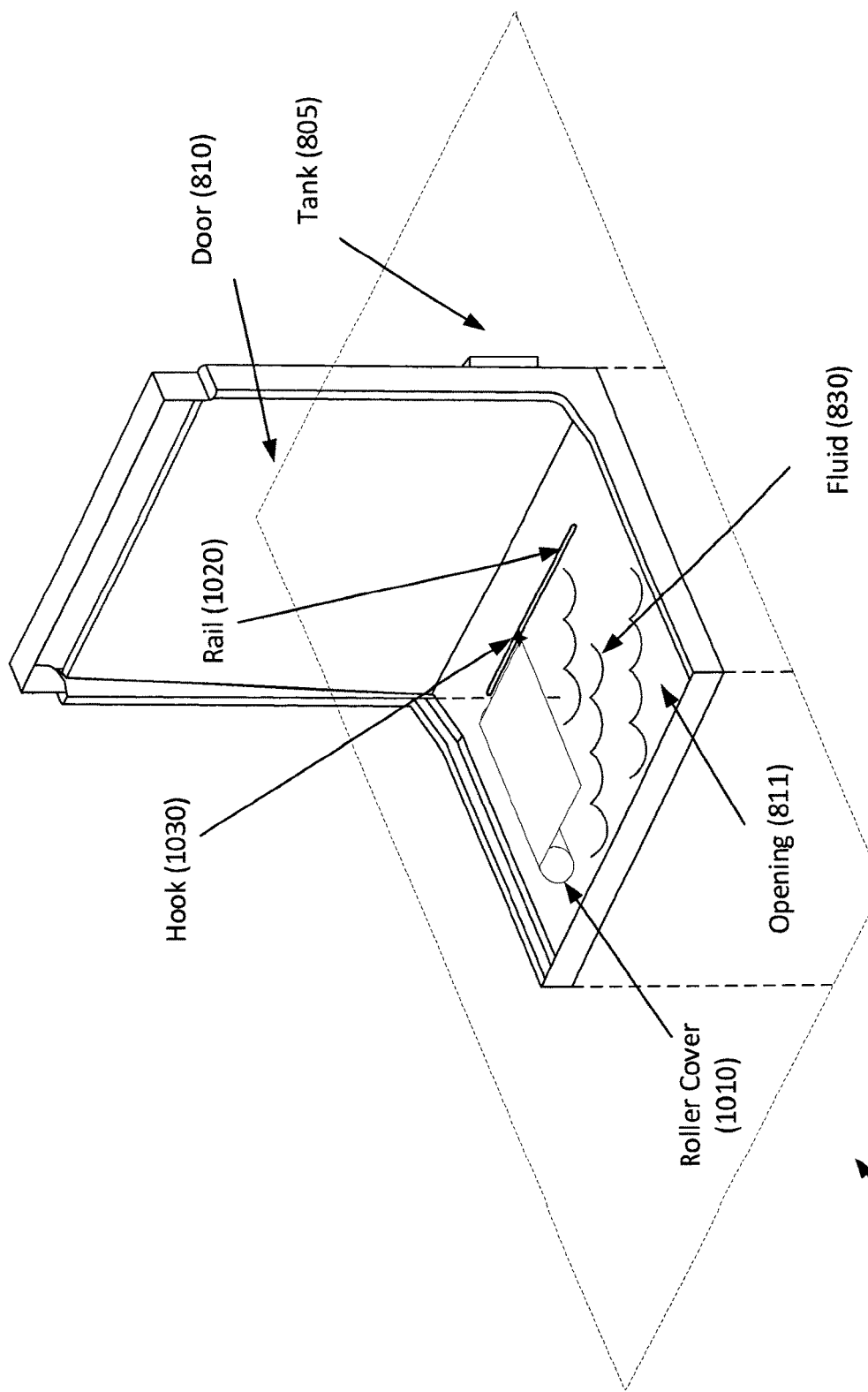
FIG. 10 shows an example covering that may be used to prevent vapor escape according to an example embodiment.

FIG. 10 shows an example tank covering according to an example embodiment. In this example embodiment, the vessel 800 can include a door 810, which can be opened for removing computer components from a tank 805 or opened for maintenance or other purposes. The tank 805 can further include one or more retractable coverings or roller coverings 1010 which can extend and cover a part or all of the opening 811. The coverings are typically located below the lid and above the liquid fluid so as to prevent vapor losses while the lid is open for any reason. In one example embodiment, in order to prevent evaporation of fluid while swapping computer components, the roller covering 1010 can be extended to cover the top of the computer components. that are not being replaced by a robot or by hand or by hoist or crane. In one example, the vessel 800 can include two or more roller coverings 1010 each with an associated rail 1020 or alternatively the two or more roller coverings 1010 may share one rail 1020. The orientation of the one or more roller coverings 1010 can be parallel to the orientation of the computer components. In this manner when a computer component is being replaced, each roller covering can extend to cover all computer components next to the subject computer component. For example, if server 12 is being replaced, then one roller covering or progression based covering may cover servers 1-11 while a second roller covering covers servers 13 on. After server 12 is serviced or replaced, then the lid is closed and the rollers are rolled up to their original position. In one example, the tank 810 can include a rail 1020 on each side of the roller covering 1010. The roller covering 1010 can include a hook 1030 which couples the roller covering 1010 up to the rail 1020 and facilitates movement of the roller covering 1010 in the tank 810. The roller covering 1010 and/or the hook 1030 can be connected to an actuator for mechanical movement.

The roller covering may be comprised of any material or combination of materials so long as the material or materials do not allow permeation of dielectric fluid or otherwise interfere with the operation of the system due to, for example, introducing substantial contaminants. Suitable materials may include, for example, plastics, metals, or combinations thereof—preferably plastics that do not introduce undesirable levels of contaminants into the systems. In one embodiment the roller covering comprises a metal or a combination of metals with a series of hinges such that it may roll in a manner similar to a garage door.

The roller covering may be actuated in any convenient manner, for example, manually, electrically, pneumatically, etc. In some embodiments, the roller covering or coverings are operably connected to a controller for management of all or a portion of the entire system of components, e.g., sensors, pressure and temperature control, power, etc. In this manner the controller may automatically actuate the one or more roller coverings in the proper manner prior to the lid being opened for any reason, for example, maintenance, server failure, server change, etc.

Gap Filler Blocks or Server Extenders

In one example embodiment, in order to minimize the amount of fluid required to fill the bath area of a tank, gap filler blocks including, for example, server extenders can be added to the system wherever needed. In one example embodiment, the gap filler blocks or server extenders can be employed which are relatively easy to place and remove. In this example embodiment, one or more gap filler blocks or server extenders can be added at, for example, near or in the chassis to minimize the space required to fill the chassis with liquid. In one example, the gap fillers can be made from any material or combination of materials that are compatible with the dielectric fluid and/or do not substantially interfere with the functioning of the system. Such materials include, but are not limited to, polycarbonate, steel, HDPE, TEPP, expanded polypropylene, and any combination thereof. In one example, the gap filler blocks can be screwed to the chassis to ensure that the blocks do not move during the operation of the vessel. In one example, the gap fillers can be filled with air. In some embodiments, the gap fillers or server extenders may also function as a heat sink to remove heat from the dielectric liquid or can act as a duct to direct the fluid toward the components to be cooled.

In some embodiments, the gap fillers may be one or more server extenders. This may be particularly useful because servers come in various sizes. An extender may be useful to change enlarge the length, width, and/or height of a given server. In this manner two or more servers up to all the servers in the system may be of substantially uniform dimensions within the system. This may be useful for filling gaps to reduce fluid needed and/or facilitating automation since various robots can be configured to place the same size components.

Spray Mechanism for Reintroducing the Fluid into the Bath Area

In one example embodiment, an immersion cooling system or a vessel can include a bath area, a sump area, a computing device, a pressure control system and a management system. The vessel can be a pressure controlled tank maintained at or near the atmospheric pressure (or within a range thereof) which can be cooled using a heat exchanger. The computing device can be immersed in a dielectric fluid in the bath area of the vessel. In one example embodiment, the vessel can include a pump for drawing the fluid from the bath area or the sump area. The pump can run the fluid through a filter and return the fluid to the sump area or the bath area.

In one example embodiment, the computing device can be placed inside a chassis. A robot can lift the chassis when the computer component needs to be removed from the tank (e.g., when instructed by the management system) or can place the chassis within the tank if the computer component needs to be placed inside the tank (e.g., when instructed by the management system).

In some embodiments dielectric fluid may be directed at the heated computer components or servers to better cool them and/or provide turbulence so that contaminants do not accrue on the component or server. In one example embodiment, the tank can include a conduit (such as a pipe) and a nozzle for spraying the fluid at the chassis. For example, a pipe can run at the bottom of the tank, and the pipe can have nozzles such that each nozzle points to a chassis. The nozzle can direct the flow of fluid at the computer component inside each chassis. By pointing the flow of the fluid at the computer component, a stream of fluid can wash the computer component, thereby preventing any residue attaching to the computer components. In one example embodiment, the pipe can run on a side or on the top of the tank, and the nozzles can point to the chassis from the side or top of the chassis. In one example embodiment, the chassis can include a hole where the nozzle is directing the fluid.

Figure 11:
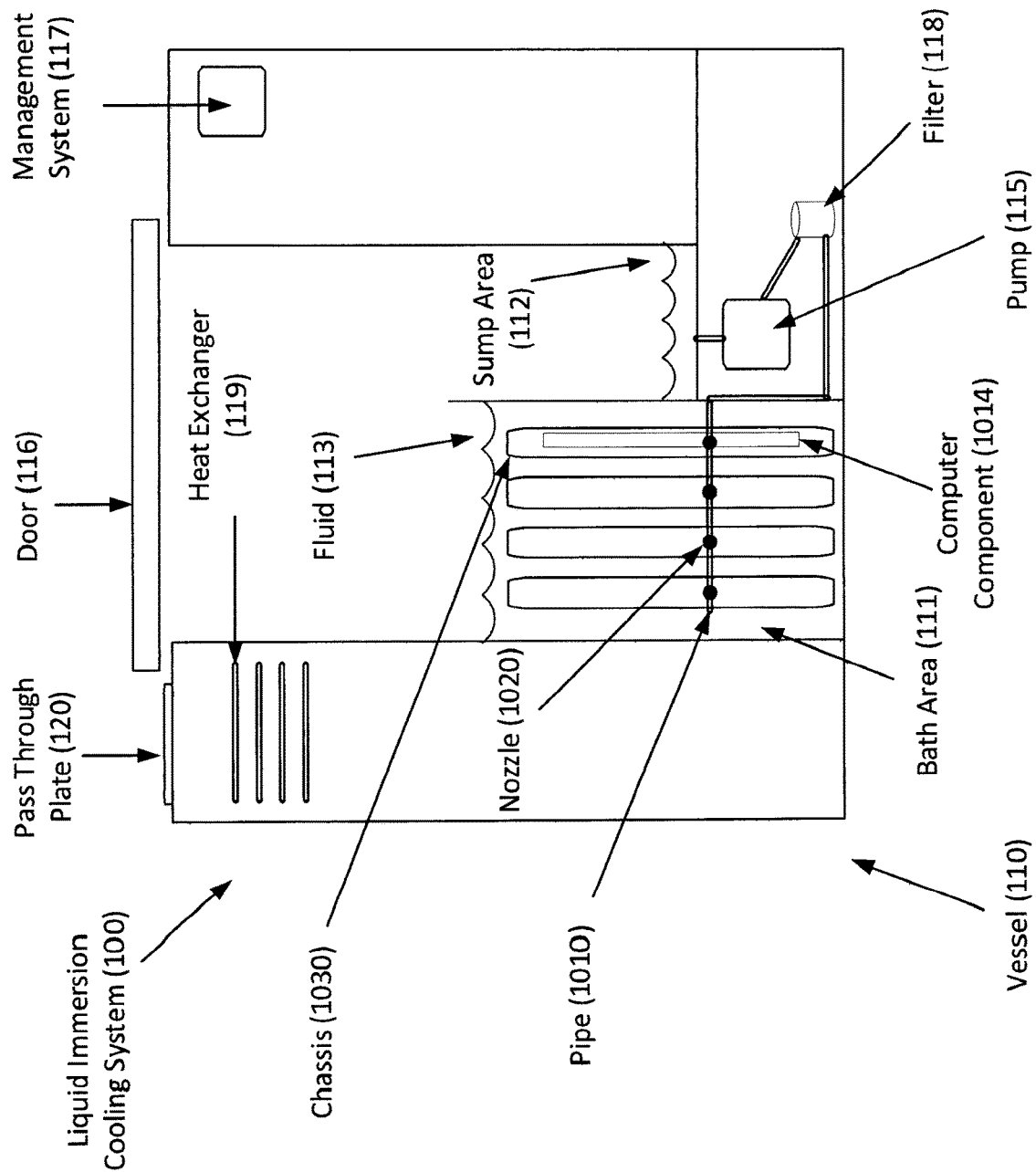
FIG. 11 shows a liquid immersion cooling system with a spray component to prevent contamination and/or improve performance according to an example embodiment of the present disclosure.

FIG. 11 shows a liquid immersion cooling system 100 according to an example embodiment of the present disclosure. In this example embodiment, the liquid immersion cooling system 100 can include a vessel 110. The vessel 110 can include a bath area 111, a sump area 112, a fluid 113, a computer component 1014, a pump 115, a filter 118, a door 116, a management system 117, a heat exchanger 119 and a pass through plate 120. The computer component 1014 can be submersed in the fluid 113.

The liquid immersion cooling system 100 can include a pipe 1010 which is connected to the pump 115. The pipe 1010 can include one or more nozzles 1020 for directing the fluid at the computer component 1014, which may have been placed inside a chassis 1030. In this example embodiment, the pump 115 can draw the fluid from the sump area and pass it through the filter 118. The pump 115 may also be used to flush the contaminants out or this may be done via a separate pump if desired. Thereafter, the fluid can be transferred to the pipe 1010, which can spray the fluid at the computer component 1014 through the nozzle 1020. The computer component 1014 can be located inside the chassis 1030. The nozzle 1020 may be attached to the chassis 1030 if desired.

In one example embodiment, the pump can draw the fluid from the bath area through the pipe 1010. In this example embodiment, the nozzle may be replaced with another component to facilitate drawing the fluid.

Protection of Pump

Figure 12:
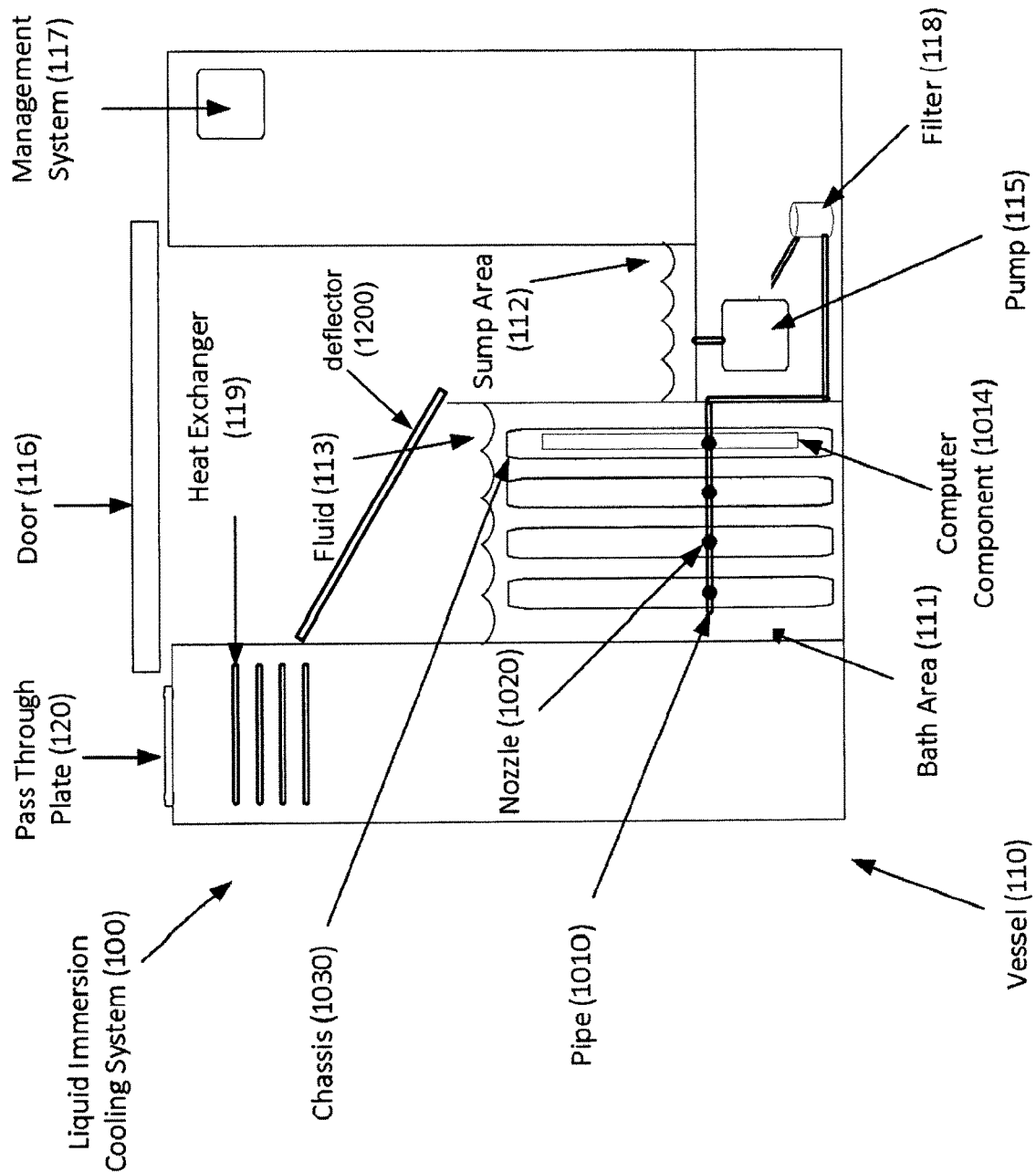
FIG. 12 shows a condenser deflector to direct cooled fluid to a pump to protect pump against failure as an example embodiment.

In some systems such as those similar to FIG. 11 the pump 115 may be prone to failures such as cavitation due to factors such as the heated fluid environment (near boiling point of dielectric fluid) or vapor generation at the pump blades, the viscous and/or dense nature of the dielectric fluid, and/or the general demands place on the motor and impeller from the system. In such cases it may be useful to cool the environment surrounding the pump to protect the pump from failure and/or extend the life of the pump. Such cooling can be in any convenient manner and the amount of cooling may vary depending upon the needs of the system and pump. In one embodiment it may be useful to direct at least a portion up to all of the subcooled fluid directly from the heat exchanger or condenser to the location of the pump which may be in sump area or elsewhere depending upon the system. The directing of the subcooled fluid may be accomplished in any convenient manner. In some embodiments the subcooled fluid may be piped directly to the pump area. In another embodiment a deflector or gutter type system could be employed to move subcooled fluid to the desired location. In other additional or alternative embodiments the fluid surrounding the pump could be cooled via a refrigeration or other cooling apparatus. FIG. 12 shows a deflector or condensate collector 1200 employed to move subcooled fluid to a location near the pump which may be in a sump area. Such a deflector may be replaced by or in addition to pipe which could also be used to move subcooled fluid near the pump to protect it. Additionally or alternatively, a condenser may be directly atop a sump area where a pump resides and either some of the fluid may be directed toward the main tank with some to the sump or in some embodiments all the fluid may be allowed to go to sump area and then circulated to the main tank in a convenient manner.

In the preceding specification, various embodiments have been described with references to the accompanying drawings. It will, however, be evident that various modifications and changes may be made thereto, and additional embodiments may be implemented, without departing from the broader scope of the invention as set forth in the claims that follow. The specification and drawings are accordingly to be regarded as an illustrative rather than restrictive sense.

We claim:

1. A system comprising:
   a vessel configured to hold thermally conductive, condensable dielectric fluid;
   a pressure controller to reduce or increase an interior pressure of the vessel;
   a computer component configured to be at least partially submerged within the dielectric fluid;
   a fluid circulation system configured to draw the dielectric fluid from a sump area of the vessel, pass the dielectric fluid through a filter and deliver the dielectric fluid to a bath area of the vessel;
   a pass through plate provided on the vessel and having a module and a conductor for transmitting signals from one side of the pass through plate to another side of the pass through plate, wherein the pass through plate and the module are hermetically sealed by an epoxy; and
   a door provided on the vessel, the door openable to provide access to an interior of the vessel for removal of the computer component, wherein the door is independent of the pass through plate.

2. The system of claim 1, wherein the pressure controller includes a vent that is fluidly coupled to a bellows, an air-vapor separator and the vessel.

3. The system of claim 2, wherein a pressure valve, a vacuum valve, or both is provided between the air-vapor separator and the vent.

4. The system of claim 3, further comprising a pressure sensor inside the vessel and a management system.

5. The system of claim 4, wherein the management system is configured to detect a pressure inside the vessel and open the pressure valve if the pressure exceeds a first threshold or falls below a second threshold.

6. The system of claim 3, further comprising a desiccant coupled to the air-vapor separator and a vapor detection sensor.

7. The system of claim 6, further comprising an inlet-outlet coupled to the desiccant.

8. The system of claim 1, further comprising (1) a carbon trap attached to a frame or (2) a vapor-air separator.

9. The system of claim 1, further comprising a ledge attached to the door.

10. The system of claim 1, further comprising a roller covering or an overlay.

11. The system of claim 10, wherein the roller covering or the overlay is configured to extend from a side of the vessel to another side of the vessel.

12. The system of claim 10, wherein the roller covering or the overlay is configured to extend over the computer component.

13. The system of claim 1, wherein the pass through plate comprises a second module for transmitting signals or fluids.

14. The system of claim 1, wherein a pump is configured to transfer the dielectric fluid to a pipe that is fluidly coupled to a chassis which holds the computer component.

15. The system of claim 14, wherein the pipe includes a nozzle.

16. The system of claim 1, wherein a pump is configured to transfer the dielectric fluid to a pipe that is configured to deliver a stream of the dielectric fluid to the computer component.

17. The system of claim 1, wherein the system is configured to employ the dielectric fluid to cool a pump to protect it from premature failure.

18. The system of claim 17, wherein the system is configured to direct condensed dielectric fluid from a condenser towards the sump area.

19. A system comprising:
    a vessel configured to hold thermally conductive, condensable dielectric fluid;
    a pressure controller to reduce or increase an interior pressure of the vessel;
    a computer component configured to be at least partially submerged within the dielectric fluid;
    a fluid circulation system configured to draw the dielectric fluid from a sump area of the vessel, pass the dielectric fluid through a filter and deliver the dielectric fluid to a bath area of the vessel; and
    a pass through plate having a sub-plate that allows for inflow and outflow of dielectric fluid to the vessel, wherein the pass through plate and the sub-plate are hermetically sealed by an epoxy.

20. A system comprising:
    a vessel configured to hold thermally conductive, condensable dielectric fluid;
    a pressure controller to reduce or increase an interior pressure of the vessel;
    a computer component configured to be at least partially submerged within the dielectric fluid;
    a fluid circulation system configured to draw the dielectric fluid from a sump area of the vessel, pass the dielectric fluid through a filter and deliver the dielectric fluid to a bath area of the vessel; and
    a pass through plate having a plurality of sub-plates, each of the plurality of the sub-plates allowing for communication into and out of the vessel, wherein the pass through plate and each of the plurality of sub-plates are hermetically sealed by an epoxy.

21. The system of claim 20, wherein at least one of the plurality of sub-plates allows electrical communication into and out of the vessel and another at least one of the plurality of sub-plates allows fluid communication into and out of the vessel.

* * * * *